US011822748B2

(12) United States Patent
Zheng

(10) Patent No.: US 11,822,748 B2
(45) Date of Patent: Nov. 21, 2023

(54) TOUCH DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Yuan Zheng, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/283,277

(22) Filed: Jun. 2, 2023

(65) Prior Publication Data

US 2021/0357072 A1    Nov. 18, 2021

Related U.S. Application Data

(63) Continuation-in-part of application No. 16/630,866, filed as application No. PCT/CN2019/099277 on Aug. 5, 2019, now Pat. No. 11,043,541.

(30) Foreign Application Priority Data

Jul. 16, 2019  (CN) .......................... 201910638951.4
Jul. 15, 2020  (CN) .......................... 202010680988.6

(51) Int. Cl.
*G06F 3/042*  (2006.01)
*G06F 3/044*  (2006.01)
*H04M 1/02*  (2006.01)

(52) U.S. Cl.
CPC .......... *G06F 3/0425* (2013.01); *G06F 3/0443* (2019.05); *G06F 3/0446* (2019.05); *G06F 3/0448* (2019.05); *H04M 1/0266* (2013.01)

(58) Field of Classification Search
CPC . H01L 27/323; H01L 27/3276; H01L 29/786; H01L 51/5237; G06F 3/044
See application file for complete search history.

(56) References Cited

U.S. PATENT DOCUMENTS

2016/0026290 A1  1/2016  Liu
2018/0039349 A1  2/2018  Han
(Continued)

FOREIGN PATENT DOCUMENTS

CN      104393021 A     3/2015
CN      107340905 A    11/2017
(Continued)

OTHER PUBLICATIONS

Chinese Office Action issued in corresponding Chinese Patent Application No. 202010680988.6 dated Jan. 27, 2022, pp. 1-8.

*Primary Examiner* — Kyoung Lee
(74) *Attorney, Agent, or Firm* — PV IP PC; Zhigang Ma; Wei Te Chung

(57) ABSTRACT

A touch display device is provided. At least one touch electrode includes a first part corresponding to each of at least one additional function area and a second part corresponding to a normal display area. Length and width of at least one trace of a connecting part between each adjacent two of touch sensing parts in the first part are increased to reduce capacitance difference between the first part and the second part. Areas without any pixel unit in each of the at least one additional function area form light transmissive areas, respectively. Thus, a transmission percentage is increased. Touch and display functions of each of at least one additional function area are ensured to be normal, and the transmission percentage is increased at the same time.

11 Claims, 5 Drawing Sheets

(56) References Cited

U.S. PATENT DOCUMENTS

2018/0136759 A1* 5/2018 Bae ..................... G06F 3/044
2018/0157350 A1   6/2018 Song

FOREIGN PATENT DOCUMENTS

| | | | |
|---|---|---|---|
| CN | 108107636 | A | 6/2018 |
| CN | 108171199 | A | 6/2018 |
| CN | 108183110 | A | 6/2018 |
| CN | 108269503 | A | 7/2018 |
| CN | 109062430 | A | 12/2018 |
| CN | 109388292 | A | 2/2019 |
| CN | 109859648 | A | 6/2019 |
| CN | 109901747 | A | 6/2019 |
| CN | 110047852 | A | 7/2019 |
| JP | 2018004733 | A | 1/2018 |
| KR | 101936939 | B1 | 1/2019 |

* cited by examiner

TOUCH DISPLAY DEVICE

CROSS-REFERENCE TO RELATED APPLICATIONS

This application is a continuation in part of U.S. application Ser. No. 16/630,866, filed on Jan. 14, 2020, now U.S. Pat. No. 11,043,541, which is a US national phase application based upon an International Application No. PCT/CN2019/099277, filed on Aug. 5, 2019, which claims priority to Chinese Patent Application No. 201910638951.4, filed with the Chinese Patent Office on Jul. 16, 2019 and claims priority to Chinese Patent Application No. 202010680988.6, filed with the Chinese Patent Office on Jul. 15, 2020. The entire disclosures of the above applications are incorporated herein by reference.

FIELD OF DISCLOSURE

The present disclosure relates to a technical field of displays, and more particularly to a touch display device based on camera under panel (CUP) technology.

BACKGROUND OF DISCLOSURE

With continuous development in technology, people have higher and higher requirements for display devices. It is well known that organic light-emitting diode (OLED) display devices due to advantages of having narrow borders, being lightweight, being rollable, and being easy to be carried, etc., have received extensive attention from people.

Nowadays, full-screen designs have become the mainstream. The term "full-screen designs" is a relatively broad definition for designs of ultra-high screen-to-body ratio display devices in the display industry. A literal interpretation is that fronts of display devices are entirely screen. Display areas are completely covered by screens. Borderless designs are used for vicinities of display areas to pursue an ultra-high screen-to-body ratio close to 100%. Various mobile phone manufacturers have introduced the concept of full-screen; 18:9 screens, 18.5:9 screens, 19.5:9 screens, and notch screens have appeared in succession. Various screen manufacturers focus on developing full-screen products with higher screen-to-body ratios. However, because of some indispensable basic functions of mobile phones such as front cameras and light sensors, certain gaps need to be left at the tops of screens of existing mobile phones to accommodate aforementioned functional components. Full-screen mobile phones claimed by the industry have not been able to achieve 100% screen-to-body ratios for front screens of mobile phones.

To prevent components such as front cameras and light sensors from occupying space in upper border areas of screens and thus to further increase screen-to-body ratios, camera under panel (CUP) technology is developed. For CUP technology, components such as front cameras and light sensors are placed correspondingly under CUP areas of display panels. When cameras are not needed to be used, CUP areas can normally display images; when cameras are needed to be used, external light can enter cameras through CUP areas, facilitating imaging.

With development in portable electronic display apparatuses, touch technology provides a new type of human-computer interface, which is more direct and user-friendly to use. Touch technology and flat display technology are integrated together to form touch display devices. Thus, flat display devices have touch functions that enable input by fingers, styli, etc., resulting in more intuitive and simpler operation.

In CUP areas of touch display devices based on CUP, disposition of display units and touch layers severely impact transmission percentages of CUP areas. Thus, how normal touch and display functions are ensured while a transmission percentage is increased is a new technical problem for CUP areas of touch display devices based on CUP.

SUMMARY OF DISCLOSURE

An object of the present disclosure is to provide a touch display device for which touch and display functions of an additional function area are ensured to be normal, and a transmission percentage is increased at the same time.

In order to achieve the aforementioned object, the present disclosure provides a touch display device including a display area including at least one additional function area and a normal display area around each of the at least one additional function area. The touch display device includes a touch layer. The touch layer includes a plurality of touch electrodes arranged in an array, wherein at least one of the touch electrodes includes a first part corresponding to each of the at least one additional function area and a second part corresponding to the normal display area. The first part includes a plurality of first touch sensing parts and a plurality of first connecting parts. Each of the first touch sensing parts has a grid shape defining at least one touch opening and each of the first connecting parts connects adjacent two of the first touch sensing parts. All of the first touch sensing parts are arranged in an array and a plurality of rows of the first touch sensing parts and a plurality of columns of the first touch sensing parts intersect in an array form to define a plurality of light transmissive areas, wherein no pixel units are disposed in any of the light transmissive areas.

Advantages of the present disclosure are as follows: For the touch display device of the present disclosure, in each of the at least one additional function area, areas without any pixel unit form the light transmissive areas, respectively. And in the touch layer, no touch electrode traces are disposed correspondingly in any of the light transmissive areas. Thus, a transmission percentage of each of the at least one additional function area is increased. For the touch display device of the present disclosure, distance between each adjacent two of the touch sensing parts of the at least one of the touch electrodes in each of the at least one additional function area is increased. Thus, area of each of the light transmissive areas is enlarged, further increasing the transmission percentage. For the touch display device of the present disclosure, width of each of at least one trace of the connecting part connecting each adjacent two of the touch sensing parts of the at least one of the touch electrodes in each of the at least one additional function area is increased. Thus, whereas at least one dummy electrode pattern is reduced, it is possible to ensure area of traces of the at least one of the touch electrodes in each of the at least one additional function area, increasing capacitance. For the touch display device of the present disclosure, the touch function and the display function of each of the at least one additional function area are ensured to be normal, the touch and display functions of the entire display panel are ensured to be normal, and the transmission percentage is increased at the same time. Thus, realization of CUP technology is facilitated and realization of full-screen designs is facilitated.

DESCRIPTION OF DRAWINGS

In order to describe a technical solution in embodiments more clearly, drawings required to be used by the embodiments are briefly introduced below. Obviously, the drawings in the description below are only some embodiments of the present disclosure. With respect to persons skilled in the art, under a premise that inventive efforts are not made, other drawings can be obtained based on these drawings.

DETAILED DESCRIPTION OF PREFERRED EMBODIMENTS

Embodiments of the present disclosure are described in detail below and examples of the embodiments are illustrated in the accompanying drawings, wherein same or similar labels throughout the present disclosure represent corresponding same or similar elements or corresponding elements having same or similar functions. The terms "first", "second", "third", etc., (if any) in the description and claims of this application and the accompanying drawings are used to distinguish similar objects, and not necessarily used to describe a specific order or sequence. It should be understood that the objects described in this way can be interchanged under appropriate circumstances. In the description of the present disclosure, the meaning of "a plurality of" is two or more, unless otherwise definitely and specifically defined. In addition, each term of the terms "comprise" and "have" and any variations thereof are intended to cover a non-exclusive inclusion. Directional terms mentioned in the present disclosure, such as "upper", "lower", "left", "right", "front", "back", "outer", "side", etc., are only directions with reference to the accompanying drawings In the description of the present disclosure, it should be noted that unless otherwise definitely specified and defined, the terms "connected", "connection", etc. should be interpreted broadly, for example, as a fixed connection or an integral connection; as an electrical connection or a connection for communicating with each other; and as being directly connected or being indirectly connected through an intervening medium. To persons skilled in the art, the specific meanings of the aforementioned terms in the present disclosure can be appreciated on the basis of corresponding specific situations.

Figure 1A:
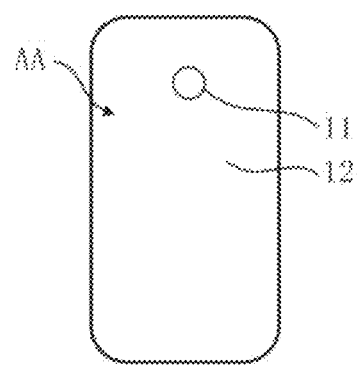
FIG. 1A is a structural diagram of a touch display device of the present disclosure.
Figure 1B:
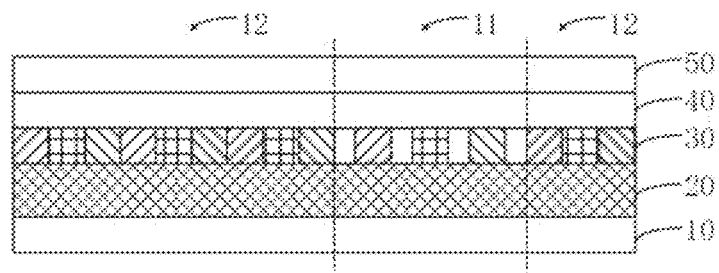
FIG. 1B is a cross-sectional diagram of a layered structure of a touch display device of an embodiment of the present disclosure.

Referring to both FIGS. 1A and 1B, FIG. 1A is a structural diagram of a touch display device of the present disclosure, and FIG. 1B is a cross-sectional diagram of a layered structure of a touch display device of an embodiment of the present disclosure.

As illustrated in FIG. 1A, the touch display device of the present disclosure is based on CUP technology. The touch display device includes a display area AA including at least one additional function area 11 and a normal display area 12 around each of the at least one additional function area 11.

As illustrated in FIG. 1B, in the present embodiment, the touch display device of the present disclosure is an organic light-emitting diode (OLED) touch display device, a layered structure of which includes a substrate 10 and a thin film transistor (TFT) array layer 20, a light-emitting functional layer 30, a thin film encapsulation (TFE) layer 40, and a touch layer 50 based on direct on-cell touch (DOT) disposed in sequence on the substrate 10.

Specifically, the substrate 10 can include a rigid layer and a flexible layer (not illustrated) disposed in sequence. Material of the rigid layer can be glass. Material of the flexible layer can be polyimide (PI).

Specifically, the TFT array layer 20 includes all film layers forming a circuit driving the light-emitting functional layer 30 so that the light-emitting functional layer 30 emits light. Further, the TFT array layer 20 includes metal traces (not illustrated). The metal traces specifically include a plurality of data lines and a plurality scan lines, etc., disposed in the TFT array layer 20. A pixel defining layer (not illustrated) is disposed on the TFT array layer 20. The pixel defining layer defines a plurality of pixel openings. Each of the pixel openings is configured to define a pixel unit of the touch display device. The pixel unit can be a red sub-pixel unit, a green sub-pixel unit, or a blue sub-pixel unit. For specific disposition manner of the TFT array layer 20, refer to the related art. Details are omitted here.

Specifically, the light-emitting functional layer 30 generally include an anode, a hole-injection layer (HIL) disposed on the anode, a hole-transporting layer (HTL) disposed on the HIL, an emissive layer (EML) disposed on the HTL, an electron-transporting layer (ETL) disposed on the EML, an electron-injection layer (EIL) disposed on the ETL, and a cathode disposed on the EIL. Light-emitting material of the EML can be organic light-emitting material. A light emission principle of OLED display devices is that semiconductor material and organic light-emitting material are driven by electric fields, and light emission is caused by carrier injection and recombination. Light emitting material is correspondingly disposed in an area defined by each of the pixel openings, and thus a light-emitting unit is formed. When driven by the TFT array layer 20, the light-emitting unit emits light (i.e., a corresponding pixel unit is formed). In the normal display area 12, an existing regular disposition manner is used by the light-emitting functional layer 30. In parts of each of the at least one additional function area 11, no light-emitting units are disposed (i.e., for equal area, a number of light-emitting units in each of the at least one additional function area 11 is less than a number of light-emitting units in the normal display area 12). Thus, a transmission percentage of each of the at least one additional function area 11 is increased. For specific disposition manner of various functional layers of the light-emitting functional layer 30, refer to the related art. Details are omitted here.

Specifically, the TFE layer 40 is configured to encapsulate the light-emitting functional layer 30 and the TFT array layer 20.

Specifically, the touch layer 50 is directly disposed on the OLED display panel. That is, DOT technology is used. The touch layer 50 includes a plurality of touch electrodes arranged in an array, wherein at least one of the touch electrodes includes a first part A (illustrated in FIG. 3) corresponding to each of the at least one additional function area 11 and a second part B (illustrated in FIG. 3) corresponding to the normal display area 12.

The first part A includes a plurality of first touch sensing parts A1, a plurality of first connecting parts A2, and a plurality of light transmissive areas A3. Each of the first touch sensing parts A1 has a grid shape defining at least one touch opening A11 and each of the first connecting parts A2 connects adjacent two of the first touch sensing parts A1. All of the first touch sensing parts A1 are arranged in an array and a plurality of rows of the first touch sensing parts A1 and a plurality of columns of the first touch sensing parts A1 intersect in an array form to define the light transmissive areas A3, wherein no pixel units are disposed in any of the light transmissive areas A3.

The second part B includes a plurality of second touch sensing parts B1 and at least one dummy electrode pattern B3. Each of the second touch sensing parts B1 has a grid shape defining at least one touch opening B11 and each adjacent two of the second touch sensing parts B1 can be directly connected to each other. No light transmissive areas are correspondingly disposed in the second part B. Each adjacent two of the second touch sensing parts B1 can also be connected by a second connecting part (not illustrated). Length of each of at least one trace of each of the second connecting parts is less than length of each of at least one trace of each of the first connecting parts A2. A structure of each of the at least one dummy electrode pattern B3 is same as a structure of each of the second touch sensing parts B1. The at least one dummy electrode pattern B3 is in a floating state. That is, each of the at least one dummy electrode pattern B3 also has a grid shape defining at least one touch opening, but is disconnected from any of the second touch sensing parts B1 adjacent to each of the at least one dummy electrode pattern B3 (to increase capacitance).

That is, in each of the at least one additional function area 11, areas in the touch layer 50 respectively corresponding to a plurality of areas of the light-emitting functional layer 30 in each of which no light-emitting units are disposed form the light transmissive areas A3, respectively. In each of the light transmissive areas A3, no touch electrode traces are disposed, thereby further increasing a transmission percentage of each of the at least one additional function area 11. Distance between each adjacent two of the touch sensing parts of the at least one of the touch electrodes in each of the at least one additional function area 11 is increased. Thus, area of each of the light transmissive areas A3 is enlarged. At least one dummy electrode pattern of traces of the at least one of the touch electrodes in each of the at least one additional function area 11 is reduced. But width of each of at least one trace of the connecting part connecting each adjacent two of the touch sensing parts of the at least one of the touch electrodes in each of the at least one additional function area is increased, thereby increasing area of traces of the at least one of the touch electrodes in each of the at least one additional function area 11. Thus, for equal area size of the at least one additional function area 11 and the normal display area 12, area difference between overall metal area of the at least one of the touch electrodes in each of the at least one additional function area 11 and overall metal area of touch electrodes in the normal display area 12 is less. That is, capacitance difference between the two is smaller because capacitance is related to electrode area. Thus, capacitance across the touch electrodes of the entire display panel is more uniform, facilitating driving of driver integrated circuits (ICs).

Preferably, a projection of the traces of the at least one of the touch electrodes in the part A onto the TFT array layer 20 at least partially overlap a plurality of metal traces of the TFT array layer 20. That is, distribution of the traces of the at least one of the touch electrodes in the part A are located directly above distribution of the metal traces, and overlap part of the distribution of the metal traces. Thus, trace density of each of the at least one additional function area 11 is decreased, maximizing a transmission percentage of each of the at least one additional function area 11 of the touch display device.

For the present disclosure, a touch electrode pattern of each of the at least one additional function area 11 and a touch electrode pattern the normal display area 12 are designed differently. Thus, a transmission percentage of each of the at least one additional function area 11 is increased on the basis that a touch function of each of the at least one additional function area 11 is normal.

Figure 2:
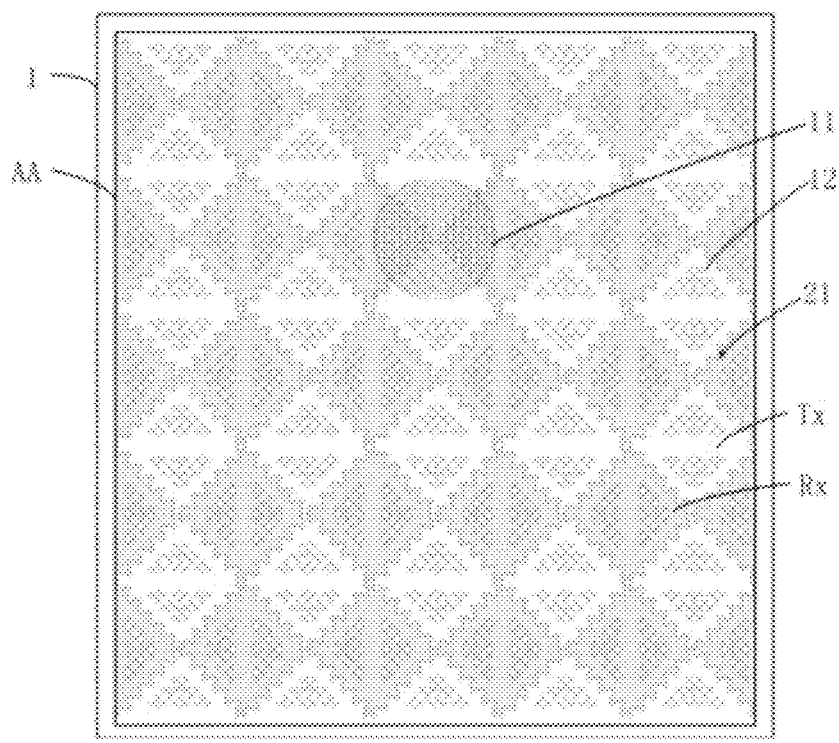
FIG. 2 is a cross-sectional diagram of a touch display device of an embodiment of the present disclosure.
Figure 3:
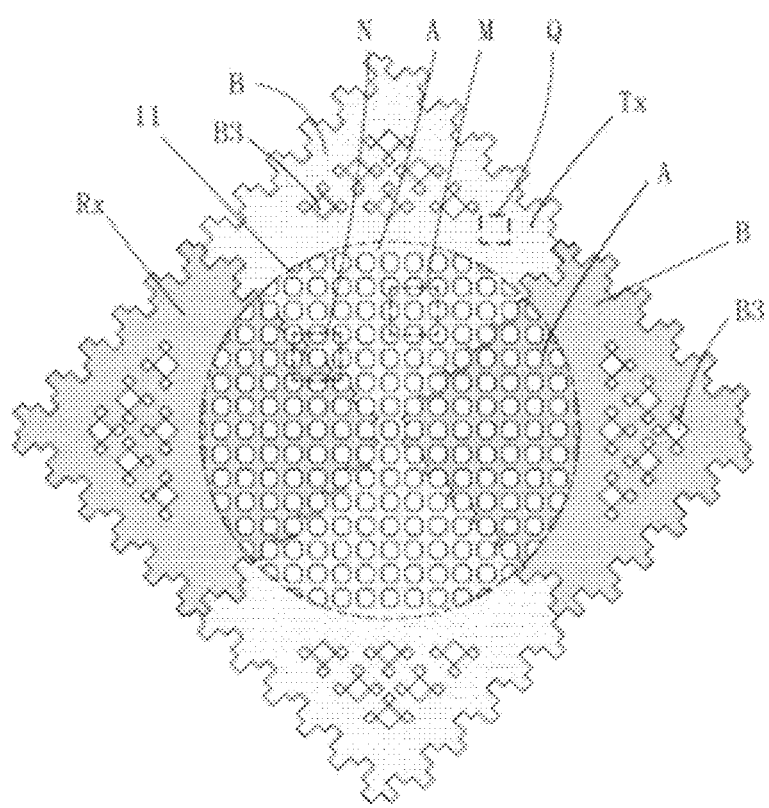
FIG. 3 is a schematic plan diagram of a part including an additional function area in FIG. 2.
Figure 4:
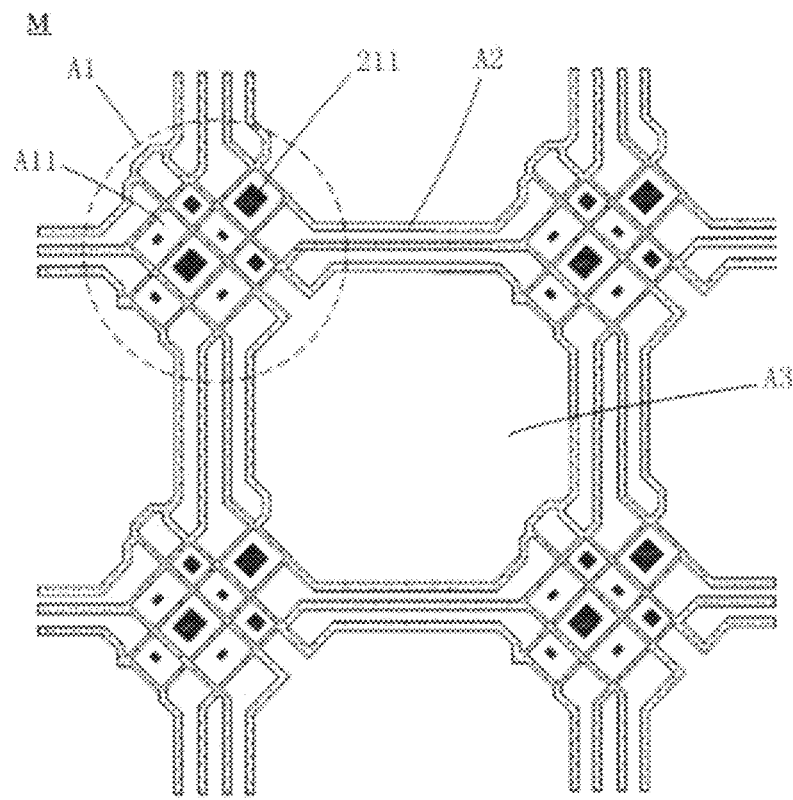
FIG. 4 is a schematic enlarged diagram of a part M of FIG. 3.
Figure 5:
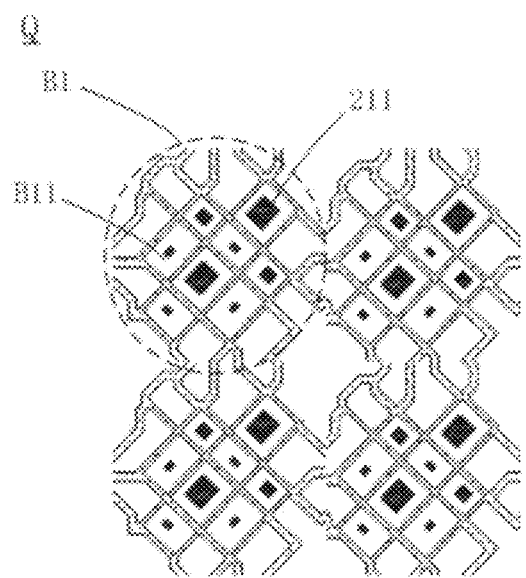
FIG. 5 is a schematic enlarged diagram of a part Q of FIG. 3.
Figure 6:
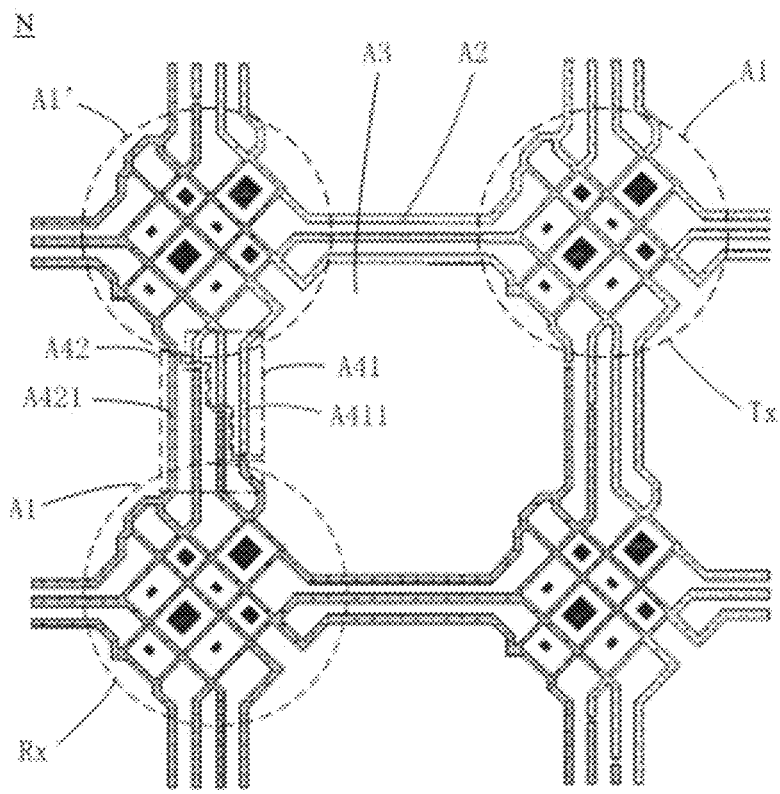
FIG. 6 is a schematic enlarged diagram of a part N of FIG. 3.
Figure 7:
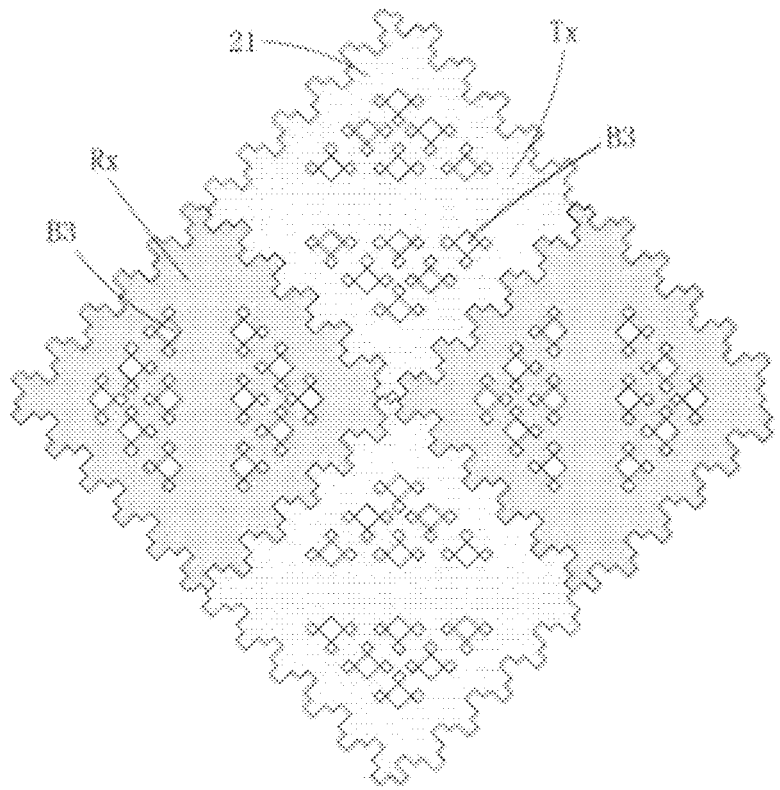
FIG. 7 is a schematic partial plan diagram of a normal display area in FIG. 2.

Referring to FIG. 1B and FIGS. 2 to 7, FIG. 2 is a cross-sectional diagram of a touch display device of an embodiment of the present disclosure, FIG. 3 is a schematic plan diagram of a part including an additional function area in FIG. 2, FIG. 4 is a schematic enlarged diagram of a part M of FIG. 3, FIG. 5 is a schematic enlarged diagram of a part Q of FIG. 3, FIG. 6 is a schematic enlarged diagram of a part N of FIG. 3, and FIG. 7 is a schematic partial plan diagram of a normal display area in FIG. 2.

Specifically, as illustrated in FIG. 2, a touch display device 1 includes a display area AA including at least one additional function area 11 and a normal display area 12 around each of the at least one additional function area 11.

For description of the present embodiment, it is taken as an example that the touch layer 50 uses a mutual-capacitance manner. The touch layer 50 includes a plurality of touch electrodes 21 arranged in an array. The touch electrodes 21 include a plurality of transmitting electrodes Tx (patterned traces running in a horizontal direction) and a plurality of receiving electrodes Rx (patterned traces running in a vertical direction) alternately arranged in sequence. Each adjacent transmitting electrode Tx and receiving electrode Rx of the transmitting electrodes Tx and the receiving electrodes Rx are spaced apart from each other. Each adjacent two of the receiving electrodes Rx are directly connected to each other. Each adjacent two of the transmitting electrodes Tx are connected to each other by a bridge. Thus, a touch function is realized. It should be noted that focus of the embodiment illustrated in FIG. 2 is arrangement of the transmitting electrodes Tx and the receiving electrodes Rx. For a connecting manner and an operating principle of the electrodes and an external part corresponding to each other, refer to the related art. Details are omitted here.

In a further embodiment, a layered structure of the touch layer 50 includes a metal film layer forming the transmitting electrodes Tx and the receiving electrodes Rx, a metal film layer forming the bridges connecting the transmitting electrodes Tx, an insulating layer between the two metal film layers, and a protecting layer (which can also be an insulating layer) configured to protect the uppermost metal film layer. The touch layer 50 can be directly disposed on the TFE layer 40. A buffer layer can also be added between the touch layer 50 and the TFE layer 40.

As illustrated in FIG. 3, in the transmitting electrodes Tx and receiving electrodes Rx arranged in the array, two of the transmitting electrodes Tx opposite to each other both include the first part A corresponding to each of the at least one additional function area 11 and the second part B corresponding to the normal display area 12, and two of the receiving electrodes Rx opposite to each other both include the first part A corresponding to each of the at least one additional function area 11 and the second part B corresponding to the normal display area 12. A structure of the entire first part A is basically same. A structure of the entire second part B is basically same.

As illustrated in FIG. 4, traces illustrated in FIG. 4 are traces of a single transmitting electrode Tx or receiving electrode Rx which are fully connected (i.e., no traces are open).

Specifically, the first part A includes a plurality of first touch sensing parts A1, a plurality of first connecting parts A2, and a plurality of light transmissive areas A3. Each of the first touch sensing parts A1 has a grid shape defining at least one touch opening A11 and each of the first connecting parts A2 connects adjacent two of the first touch sensing parts A1. All of the first touch sensing parts A1 are arranged in an array and a plurality of rows of the first touch sensing parts A1 and a plurality of columns of the first touch sensing parts A1 intersect in an array form to define the light transmissive areas A3, wherein no pixel units are disposed in any of the light transmissive areas A3.

For the present disclosure, in each of the at least one additional function area 11, areas without any pixel unit 211 form the light transmissive areas A3, respectively. And in the touch layer, no touch electrode traces are disposed correspondingly in any of the light transmissive areas A3. Thus, a transmission percentage of each of the at least one additional function area 11 is increased.

In a further embodiment, length of each of at least one trace of each of the first connecting parts A2 is greater than a predetermined length (e.g., distance between each adjacent two of the second touch sensing parts B1 in the normal display area 12). That is, distance between each adjacent two of the touch sensing parts of the at least one of the touch electrodes in each of the at least one additional function area 11 is increased. Thus, area of each of the light transmissive areas A3 is enlarged.

In a further embodiment, the at least one touch opening A11 corresponds to at least one pixel opening (which coincides with the at least one touch opening A11 illustrated in the figure). Size and shape of each of the at least one touch opening A11 match size and shape of a corresponding one of the at least one pixel opening, respectively. Each of the at least one pixel opening is configured to define a pixel unit 211 of the touch display device. The pixel unit 211 can be a red sub-pixel unit, a green sub-pixel unit, or a blue sub-pixel unit. Each of the at least one pixel opening can have a various size depending on a color to be displayed therein. The size of each of the at least one touch opening A11 match the size of the corresponding one of the at least one pixel opening, and thus a pixel aperture ratio can be increased, causing a corresponding pixel to display normally.

In a further embodiment, each of the at least one touch opening A11 is rhombus-shaped or parallelogram-shaped. There is an angle between each of the at least one touch opening A11 and a horizontal direction (a row direction of the first touch sensing parts A1 arranged in the array). The angle can be 30 degrees to 60 degrees, and preferably 45 degrees. Correspondingly, there is also an angle between the pixel unit 211 and the horizontal direction.

In a further embodiment, each of the first connecting parts A2 include at least one connecting trace. An extending direction of the at least one connecting trace of each of the first connecting parts A2 is same as a row direction or a column direction of the first touch sensing parts A1 arranged in the array.

As illustrated in FIG. 4, each of the first connecting parts A2 in the horizontal direction includes three connecting traces, and each of the first connecting parts A2 in the vertical direction includes four connecting traces. Preferably, width of each of the at least one trace of each of the first connecting parts A2 is greater than width of each of grid traces of each of the first touch sensing parts A1. Thus, area of the traces of the first part A is increased. That is, in order to increase metal area of the traces of the touch layer 50 in each of the at least one additional function area 11 (i.e., in order to increase capacitance between the Tx and Rx), the width of each of the at least one trace of each of the first connecting parts A2 is increased locally. The width of each of the at least one trace of each of the first connecting parts A2 is increased. Thus, whereas a design of at least one dummy electrode pattern is reduced, a need that for equal area size of the at least one additional function area 11 and the normal display area 12, area difference between overall metal area of the at least one of the touch electrodes in each of the at least one additional function area 11 and overall metal area of touch electrodes in the normal display area 12 is less is still met. That is, capacitance difference between the two is smaller because capacitance is related to electrode area. Thus, capacitance across the touch electrodes of the entire display panel is more uniform, facilitating driving of driver ICs.

In a further embodiment, a projection of the traces of the at least one of the touch electrodes in the part A onto the TFT array layer 20 at least partially overlap a plurality of metal traces of the TFT array layer 20. That is, distribution of the traces of the at least one of the touch electrodes in the part A are located directly above distribution of the metal traces, and overlap part of the distribution of the metal traces (i.e., concentrated traces are used). Thus, trace density of each of the at least one additional function area 11 is decreased, maximizing a transmission percentage of each of the at least one additional function area 11 of the touch display device.

As illustrated in FIG. 5, traces illustrated in FIG. 5 are traces of a single transmitting electrode Tx or receiving electrode Rx which are fully connected (i.e., no traces are open).

Specifically, the second part B includes a plurality of second touch sensing parts B1 and at least one dummy electrode pattern B3 (illustrated in FIG. 3). Each of the second touch sensing parts B1 has a grid shape defining at least one touch opening B11 and each adjacent two of the second touch sensing parts B1 are directly connected to each other. That is, no light transmissive areas are disposed in the second part B. A structure of each of the at least one dummy electrode pattern B3 is same as a structure of each of the second touch sensing parts B1. The at least one dummy electrode pattern B3 is in a floating state. That is, each of the at least one dummy electrode pattern B3 also has a grid shape defining at least one touch opening, but is disconnected from any of the second touch sensing parts B1 adjacent to each of the at least one dummy electrode pattern B3 (to increase capacitance).

In another embodiment, the second part B can also include a plurality of second connecting parts. Each of the second connecting parts connects adjacent two of the second touch sensing parts B1. But length of each of at least one trace of each of the second connecting parts is less than length of each of at least one trace of each of the first connecting parts A2. The second part B can also use an existing regular deposition manner.

Further, each of the first touch sensing parts A1 which is adjacent to one of the second touch sensing parts B1 is connected to the one of the second touch sensing parts B1 by one of the first connecting parts A2 or is directly connected to the one of the second touch sensing parts B1.

For the present disclosure, in each of the at least one additional function area, a design of the at least one dummy electrode pattern is reduced, the width of each of the at least one trace of each of the connecting parts is increased locally, ensuring the capacitance between the Tx and Rx. The areas without any pixel unit do not have any touch electrode trace disposed therein and form the light transmissive areas, respectively. Thus, the transmission percentage is increased. The distribution of the traces of the at least one of the touch electrodes of the touch layer follows the distribution of the metal traces of the TFT array layer, decreasing the trace density of the at least one of the touch electrodes and further increasing the transmission percentage. Thus, a touch function and a display function of each of the at least one additional function area are ensured to be normal, touch and display functions of the entire display panel are ensured to be normal, and the transmission percentage is increased at the same time.

A design at where a transmitting electrode Tx and a receiving electrode Rx in each of the at least one additional function area 11 cross each other is illustrated in FIG. 6. Traces illustrated in FIG. 6 include traces of the transmitting electrode Tx and traces of the receiving electrode Rx. Traces between different types of the electrodes Tx and Rx are disconnected (i.e., the traces are open).

Specifically, all of the first touch sensing parts A1 of each of the transmitting electrodes Tx at where the transmitting electrodes Tx and the receiving electrodes Rx in each of the at least one additional function area 11 cross each other have first extensions A41, respectively, and all of the first touch sensing parts A1 of adjacent one of the receiving electrodes Rx at where the transmitting electrodes Tx and the receiving electrodes Rx in each of the at least one additional function area cross each other have second extensions A42, respectively. At least one trace of each of the first extensions A41 is disposed opposite to and disconnected from at least one trace of one of the second extensions A42. That is, in each opposite two of the extensions A41 and A42, one end of each of the extensions is connected to a corresponding one of the first touch sensing parts, and another end of each of the extensions extends in a direction of another extension opposite to each of the extensions. By extending an area at where the at least one Tx trace and the at least one Rx trace overlap, capacitance between each adjacent two of the Tx and Rx is increased; and area of a light transmissive area A3 is enlarged, increasing a transmission percentage.

In a further embodiment, each of the extensions include a plurality of extension traces A411 or A421 which are parallel and spaced apart from each other. Lengths respectively of the extension traces of each of the extensions are different, and correspond to lengths respectively of the extension traces of the corresponding another of the extensions, respectively.

In a further embodiment, each of the at least one trace of each of the first extensions A41 has width greater than width of each of grid traces of each of the first touch sensing parts A1 of the transmitting electrodes Tx, and each of the at least one trace of each of the second extensions A42 has width greater than width of each of grid traces of each of the first touch sensing parts A1 of the receiving electrodes Rx. Thus, capacitance between each adjacent two of the Tx and Rx is further increased.

Preferably, the width of each of the at least one trace of each of the extensions A41 and A42 can be same as the width of each of the at least one trace of each of the first connecting parts A2 to facilitate controlling of capacitance and simplify a manufacturing process. Total length of each corresponding two of the traces of the extensions A41 and A42 is substantially same as the length of each of the at least one trace of the first connecting parts A2.

In a further embodiment, a touch sensing part A1' located at a vertex of a light transmissive area A3 may include a part of the first touch sensing part of the transmitting electrode Tx and a part of the first touch sensing part of the receiving electrode Rx, and there is no connection between the two.

As illustrated in FIG. 7, an edge of each of the touch electrodes 21 in the normal display area 12 has a zigzag structure, and the adjacent edges respectively of each adjacent two of the touch electrodes 21 (Tx and Rx) in the normal display area 12 match each other, and thus capacitance between each adjacent two of the touch electrodes 21 is increased. For disposition of a plurality of touch sensing parts of each of the touch electrodes 21 in the normal display area 12, refer to FIG. 5.

For the touch display device of the present disclosure, in each of the at least one additional function area, areas without any pixel unit form the light transmissive areas, respectively. And in the touch layer, no touch electrode traces are disposed correspondingly in any of the light transmissive areas. Thus, the transmission percentage of each of the at least one additional function area is increased. For the touch display device of the present disclosure, the distance between each adjacent two of the touch sensing parts of the at least one of the touch electrodes in each of the at least one additional function area is increased. Thus, the area of each of the light transmissive areas is enlarged, further increasing the transmission percentage. For the touch display device of the present disclosure, the width of each of the at least one trace of the connecting part connecting each adjacent two of the touch sensing parts of the at least one of the touch electrodes in each of the at least one additional function area is increased. Thus, whereas the at least one dummy electrode pattern is reduced, it is possible to ensure the area of traces of the at least one of the touch electrodes in each of the at least one additional function area, increasing the capacitance. For the touch display device of the present disclosure, the touch function and the display function of each of the at least one additional function area are ensured to be normal, the touch and display functions of the entire display panel are ensured to be normal, and the transmission percentage is increased at the same time. Thus, realization of CUP technology is facilitated and realization of full-screen designs is facilitated.

Figure 8:
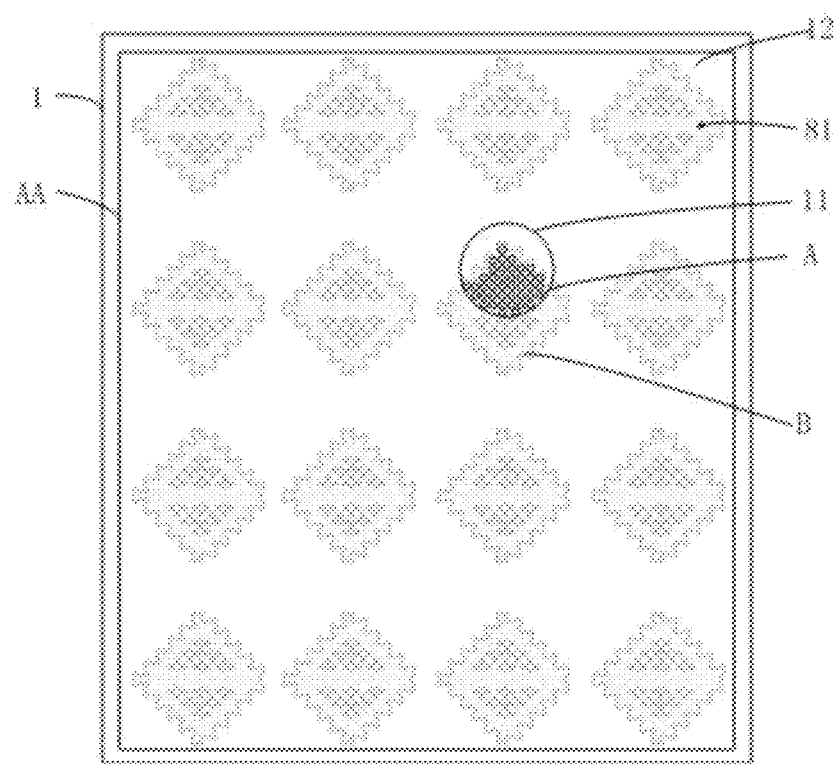
FIG. 8 is a cross-sectional diagram of a touch display device of another embodiment of the present disclosure.

Referring to both FIGS. 1B and 8, FIG. 8 is a cross-sectional diagram of a touch display device of another embodiment of the present disclosure. For description of the present embodiment, it is taken as an example that the touch layer 50 uses a self-capacitance manner. Specifically, as illustrated in FIG. 8, a touch display device 1 includes a display area AA including at least one additional function area 11 and a normal display area 12 around each of the at least one additional function area 11.

The touch layer 50 includes a plurality of touch electrodes 81 arranged in an array. For the touch electrodes 81, a single-layer metal touch film layer is used. The metal touch film layer is covered by an insulating protecting layer. The single-layer metal touch film layer can obtain coordinate information in a self-capacitance manner. It should be noted that focus of the embodiment illustrated in FIG. 8 is arrangement of the touch electrodes. For a connecting manner and an operating principle of the electrodes and an external part corresponding to each other, refer to the related art. Details are omitted here.

As illustrated in FIG. 8, in the touch electrodes 81 arranged in the array, one of the touch electrodes 81 includes a first part A corresponding to each of at least one additional function area 11 and a second part B corresponding to a normal display area 12. For a structure of the first part A of the one of the touch electrodes 81 corresponding to each of the at least one additional function area 11, refer to FIG. 4. For a structure of the second part B of the one of the touch electrodes 81 corresponding to the normal display area 12, refer to FIG. 5. Details are omitted here.

To persons skilled in the art, in accordance with the technical solutions and technical ideas of the present disclosure, various changes and modifications can be made to the description above. All these changes and modifications are within the protection scope of the claims of the present disclosure.

What is claimed is:

1. A touch display device, comprising: a display area comprising at least one additional function area and a normal display area around each of the at least one additional function area;
the touch display device comprising a touch layer, the touch layer comprising a plurality of touch electrodes arranged in an array, wherein at least one of the plurality of touch electrodes comprises a first part corresponding to each of the at least one additional function area and a second part corresponding to the normal display area;
the first part comprising a plurality of first touch sensing parts and a plurality of first connecting parts, each of the plurality first touch sensing parts having a grid shape defining at least one touch opening and each of the plurality first connecting parts connecting adjacent two of the plurality first touch sensing parts;
all of the plurality first touch sensing parts being arranged in an array and a plurality of rows of the plurality first touch sensing parts and a plurality of columns of the plurality first touch sensing parts intersecting in an array form to define a plurality of light transmissive areas, wherein no pixel units are disposed in any of the plurality light transmissive areas.

2. The touch display device of claim 1, wherein the second part comprises:
a plurality of second touch sensing parts, each of the plurality second touch sensing parts having a grid shape defining at least one touch opening and each adjacent two of the plurality of second touch sensing parts being connected to each other; and
at least one dummy electrode pattern, a structure of each of the at least one dummy electrode pattern being same as a structure of each of the plurality second touch sensing parts and the at least one dummy electrode pattern being in a floating state.

3. The touch display device of claim 2, wherein each of the plurality first touch sensing parts which is adjacent to one of the plurality second touch sensing parts is connected to the one of the plurality second touch sensing parts by one of the plurality first connecting parts or is directly connected to the one of the plurality second touch sensing parts.

4. The touch display device of claim 1, wherein width of each of at least one trace of each of the plurality first connecting parts is greater than width of each of grid traces of each of the plurality first touch sensing parts.

5. The touch display device of claim 1, wherein the at least one touch opening corresponds to at least one pixel opening, and size and shape of each of the at least one touch opening match size and shape of a corresponding one of the at least one pixel opening, respectively; each of the at least one pixel opening being configured to define a pixel unit of the touch display device.

6. The touch display device of claim 1, wherein there is an angle between each of the at least one touch opening and a row direction of the plurality first touch sensing parts arranged in the array.

7. The touch display device of claim 1, wherein the plurality of touch electrodes arranged in the array comprise a plurality of transmitting electrodes and a plurality of receiving electrodes, the plurality of transmitting electrodes crossing the plurality of receiving electrodes; two of the plurality transmitting electrodes opposite to each other both comprising the first part corresponding to each of the at least one additional function area and the second part corresponding to the normal display area, and two of the plurality receiving electrodes opposite to each other both comprising the first part corresponding to each of the at least one additional function area and the second part corresponding to the normal display area.

8. The touch display device of claim 7, wherein all of the plurality first touch sensing parts of each of the plurality of transmitting electrodes at where the plurality of transmitting electrodes and the plurality of receiving electrodes in each of the at least one additional function area cross each other have first extensions, respectively, and all of the plurality first touch sensing parts of adjacent one of the plurality of receiving electrodes at where the plurality of transmitting electrodes and the receiving electrodes in each of the at least one additional function area cross each other have second extensions, respectively; at least one trace of each of the plurality first extensions being disposed opposite to and disconnected from at least one trace of one of the plurality second extensions.

9. The touch display device of claim 8, wherein each of the at least one trace of each of the plurality first extensions has width greater than width of each of grid traces of each of the plurality first touch sensing parts of the plurality of transmitting electrodes, and each of the at least one trace of each of the plurality second extensions has width greater than width of each of grid traces of each of the plurality first touch sensing parts of the plurality of receiving electrodes.

10. The touch display device of claim 1, wherein an edge of each of the plurality of touch electrodes in the normal display area has a zigzag structure, and the adjacent edges respectively of each adjacent two of the plurality touch electrodes in the normal display area match each other.

11. The touch display device of claim 1, further comprising: a thin film transistor (TFT) array layer disposed under the touch layer, the TFT array layer comprising a plurality of metal traces; a projection of a plurality of traces of the first part of the at least one of the plurality of touch electrodes onto the TFT array layer at least partially overlapping the metal traces.

* * * * *